(12) United States Patent
Spahlinger

(10) Patent No.: US 7,639,757 B2
(45) Date of Patent: Dec. 29, 2009

(54) PULSE MODULATOR AND PULSE MODULATION METHOD

(75) Inventor: Guenter Spahlinger, Stuttgart (DE)

(73) Assignee: LITEF GmbH, Freiburg (DE)

( * ) Notice: Subject to any disclaimer, the term of this patent is extended or adjusted under 35 U.S.C. 154(b) by 606 days.

(21) Appl. No.: 10/555,716

(22) PCT Filed: May 6, 2004

(86) PCT No.: PCT/EP2004/004845

§ 371 (c)(1),
(2), (4) Date: Nov. 7, 2005

(87) PCT Pub. No.: WO2004/100382

PCT Pub. Date: Nov. 18, 2004

(65) Prior Publication Data

US 2007/0019744 A1 Jan. 25, 2007

(30) Foreign Application Priority Data

May 8, 2003 (DE) ................................ 103 20 674

(51) Int. Cl.
*H04L 27/00* (2006.01)
(52) U.S. Cl. .................. 375/324; 375/242; 375/243; 375/244; 375/245; 375/246; 375/247; 375/340; 375/342; 341/77; 341/143; 341/144
(58) Field of Classification Search .............. 375/324, 375/340, 342, 242–247; 341/77, 143–144
See application file for complete search history.

(56) References Cited

U.S. PATENT DOCUMENTS 5,450,028 A * 9/1995 Therssen ...................... 327/91
5,841,388 A * 11/1998 Yasuda et al. ............... 341/155
5,866,969 A     2/1999 Shimada et al.
5,983,719 A * 11/1999 Matthews et al. ......... 73/504.13
6,052,701 A *  4/2000 Koslov et al. ............... 708/313
6,064,871 A *  5/2000 Leung ......................... 455/323
6,087,968 A *  7/2000 Roza ........................... 341/143

(Continued)

FOREIGN PATENT DOCUMENTS

EP        0461721        12/1991

OTHER PUBLICATIONS

Article: Tao et al., "A 400-Ms/s Frequency Translating Bandpass Sigma-Delta Modulator", *IEEE Journal of Solid-State Circuits*, vol. 34, No. 12 (Dec. 1999).

*Primary Examiner*—Mohammad H Ghayour
*Assistant Examiner*—Sophia Vlahos
(74) *Attorney, Agent, or Firm*—Elloitt N. Kramsky

(57) ABSTRACT

A pulse modulator has a subtraction stage that produces a control error signal from the difference between a complex input signal and a feedback signal. A signal conversion stage converts the control error signal to a control signal. The control signal is multiplied by a complex mixing signal at the frequency $\omega_0$ in a first multiplication stage. At least one of the real and imaginary parts of the up-mixed control signal is then quantized by a quantization stage to produce a real pulsed signal. The pulsed signal is then employed to produce the feedback signal for the subtraction stage in a feedback unit. The pulse modulator according to the invention allows the range of reduced quantization noise to be shifted toward a desired operating frequency $\omega_0$.

22 Claims, 7 Drawing Sheets

U.S. PATENT DOCUMENTS

| | | |
|---|---|---|
| 6,121,910 A * | 9/2000 | Khoury et al. ............... 341/143 |
| 6,218,972 B1 * | 4/2001 | Groshong ................... 341/143 |
| 6,275,540 B1 * | 8/2001 | Barrett et al. ............... 375/316 |
| 6,317,468 B1 | 11/2001 | Meyer |
| 6,768,435 B2 * | 7/2004 | Xu ............................. 341/143 |
| 6,801,590 B2 * | 10/2004 | Schweickert et al. ........ 375/344 |
| 7,248,628 B2 * | 7/2007 | Shaeffer ..................... 375/229 |
| 2002/0159584 A1 * | 10/2002 | Sindalovsky et al. ........ 379/386 |
| 2004/0037363 A1 * | 2/2004 | Norsworthy et al. ........ 375/259 |

* cited by examiner

PULSE MODULATOR AND PULSE MODULATION METHOD

BACKGROUND

1. Field of the Invention

The present invention relates to pulse modulators. More specifically, the invention pertains to a pulse modulator for conversion of a complex input signal to a pulsed signal, and to a method for pulse modulation of a complex input signal.

2. Description of the Prior Art

Digital/analog converters may be employed to convert digital input signals to analog signals. They are, however, expensive and require a relatively large amount of electrical power as well as a number of supply voltages (frequently). They are also difficult to integrate with digital electronics and, thus, limit miniaturization.

As a result, digital/analog converters are being replaced by digital pulse modulators (e.g., sigma-delta converters) in many applications. A conventional sigma-delta modulator includes an integrator that integrates the difference signal between an input signal and a fed-back quantized signal, as well as a quantizer that quantizes the integrated signal. A quantized pulsed signal can then be tapped off at the output of the quantizer. It is fed back as a feedback signal to the input of the sigma-delta converter. Sigma-delta modulators are distinguished by a noise characteristic in which the quantization noise is shifted from the low-frequency range in the vicinity of $\omega=0$ towards higher frequencies. The noise that occurs at higher frequencies can then be suppressed with the aid of a downstream low-pass filter. Sigma-delta converters can be implemented at low cost and integrated with digital electronics. However, for some applications, it would be advantageous to be able to keep the quantization noise low at higher frequencies.

SUMMARY OF THE INVENTION

It is therefore an object of the invention to provide a pulse modulator and a method for pulse modulation in which the spectral distribution of quantization noise can be flexibly adapted.

The present addresses the preceding object by providing, in a first aspect, a pulse modulator for conversion of a complex input signal to a pulsed signal. Such modulator includes a subtraction stage that produces a control error signal from the difference between the complex input signal and a feedback signal. A signal conversion stage is provided that converts the control error signal to a control signal.

A first multiplication stage multiplies the control signal by a complex mixing signal oscillating at the frequency $\omega_0$ to produce at least one of a real part and an imaginary part of a control signal that has been up-mixed by $\omega_0$. A quantization stage quantizes at least one of the real part and imaginary part of the control signal that has been up-mixed by $\omega_0$ and thus produces the pulsed signal. A feedback unit uses the pulsed signal to produce the feedback signal for the subtraction stage.

In a second aspect, the invention provides a method for pulse modulation of a complex input signal. Such method includes the production of a control error signal from the difference between the complex input signal and a feedback signal. The control error signal is then converted to a control signal.

The control signal is multiplied by a complex mixing signal that oscillates at the frequency $\omega_0$. At least one of the real and imaginary parts of a control signal, up-mixed by $\omega_0$, is produced. At least one of the real and imaginary parts of the control signal, up-mixed by $\omega_0$, is quantized to produce a pulsed signal. The feedback signal is then produced from the pulsed signal.

The preceding and other features of the invention will become further apparent from the detailed description that follows. Such description is accompanied by a set of drawing figures. Numerals of the drawing figures, corresponding to those of the written description, point to the features of the invention. Like numerals refer to like features throughout both the written text and the drawing figures.

DETAILED DESCRIPTION OF THE PREFERRED EMBODIMENT

Figure 1:
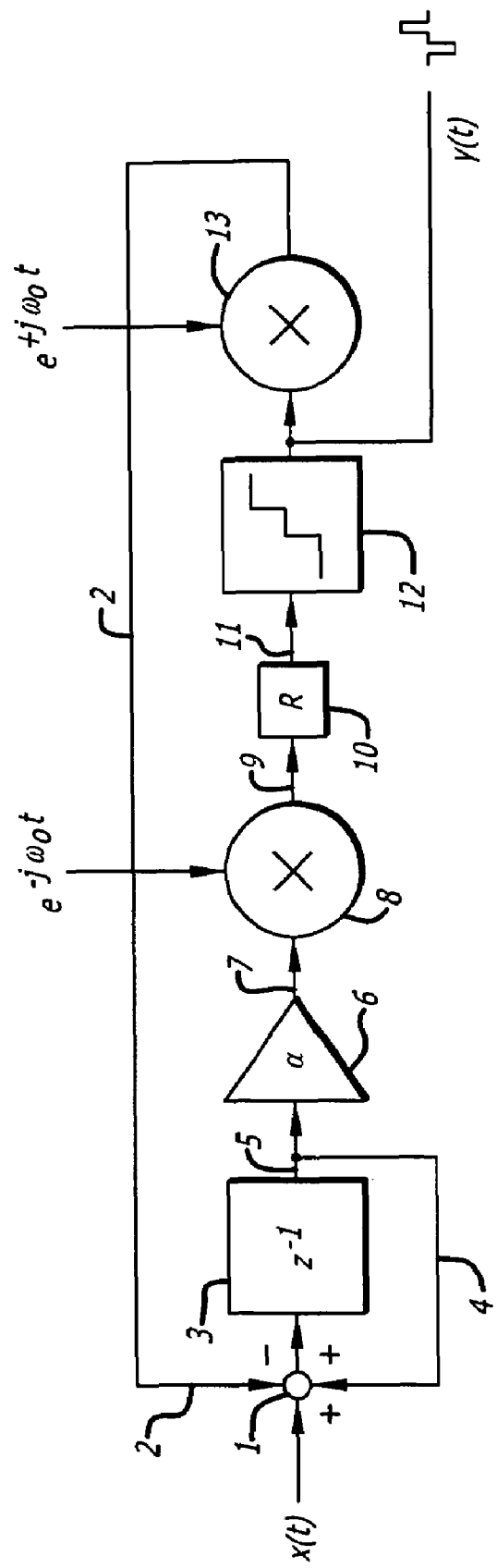
FIG. 1 is a block diagram of a pulse modulator in accordance with the invention.

FIG. 1 is a block diagram of a pulse modulator in accordance with the invention in complex form. A complex input signal x(t) includes real and imaginary parts, each represented as a digital value. A complex feedback signal 2 is subtracted from the complex input signal x(t) in the addition node 1, with their difference representing the control error. The (likewise complex) content of a delay element 3 is added to such difference at the addition node 1. (The content of the delay element 3 is passed via a signal line 4 to the addition node 1.) The delay element 3, combined with the signal line 4, forms a complex integrator stage that integrates the complex control error (i.e. the difference between the input signal and the feedback signal). The integrated signal 5 is amplified by a factor "a" in an amplifier stage 6. An amplified signal 7 is passed to a first multiplication stage 8 where it is multiplied by the complex mixing signal exp($-j\omega_0 t$) to obtain a signal 9 up-mixed to frequency $\omega_0$. A block 10 determines the real part 11 of the complex up-mixed signal 9 and this is applied to a quantizer 12.

The quantizer 12 of the embodiment of FIG. 1 is a ternary quantizer that converts the input signal to the three possible values $-1, 0, +1$ of a pulsed signal with the aid of comparators. The quantized pulsed signal y(t) thus produced can be tapped off at the output of the quantizer 12. The real pulsed signal y(t) is multiplied in a second multiplication stage 13 by the complex-conjugate mixing signal exp($-j\omega_0 t$) to produce the complex feedback signal 2. The complex feedback signal 2, obtained by multiplication of a real and a complex number, is passed to the addition node 1 at the input to the circuit.

The sequence of functional units illustrated in FIG. 1 can be implemented by means of a digital signal processor (DSP)

or by dedicated hardware. The digital signal processing must be carried out at a sampling frequency $\omega_A$ that is considerably higher than the frequency $\omega_0$ of the complex mixing signal (e.g. 2 to 1000 times the mixing frequency $\omega_0$ may be used as the sampling rate $\omega_A$).

Figure 2:
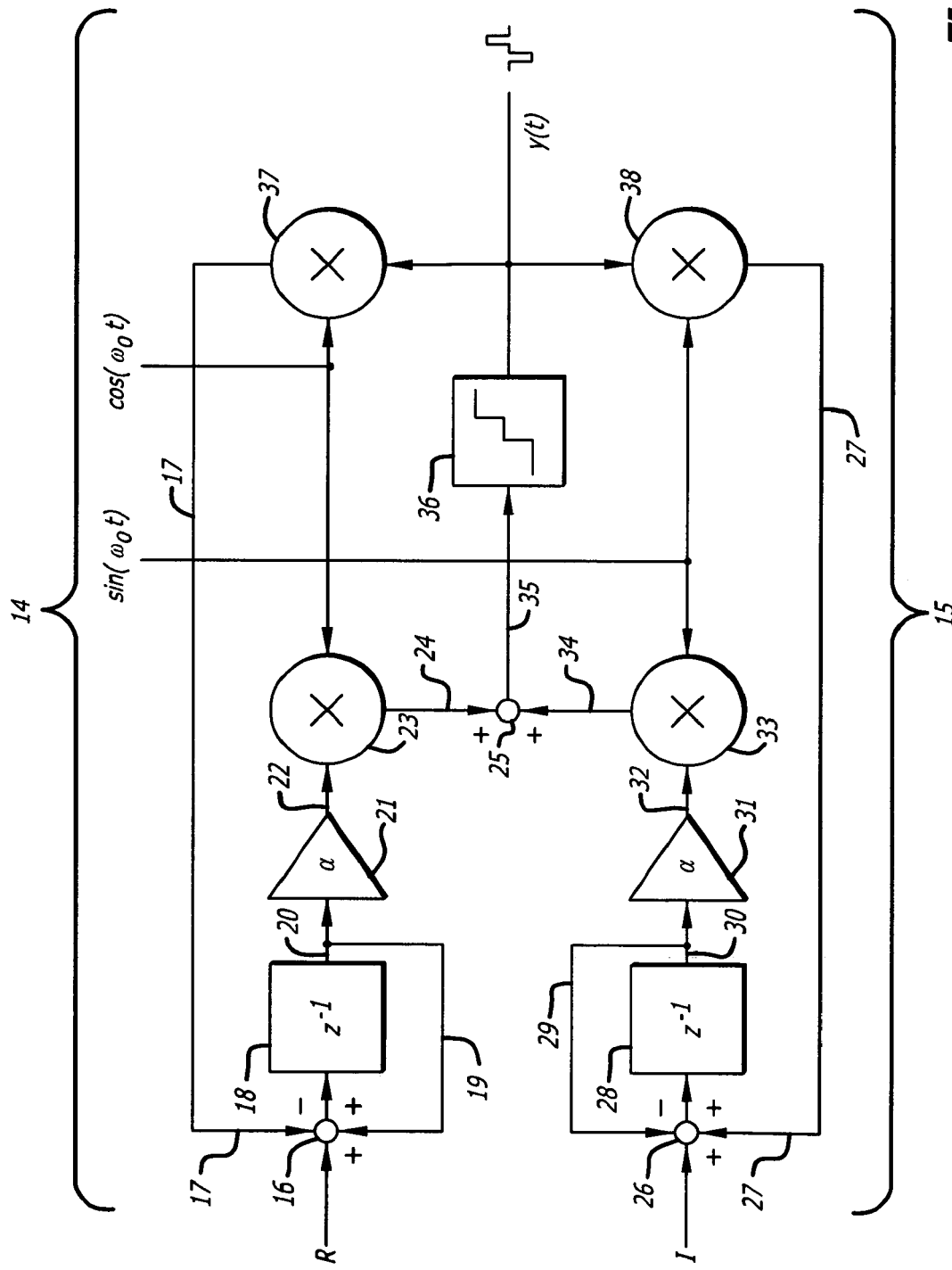
FIG. 2 is a block diagram of a pulse modulator, with the in-phase path and the quadrature path shown separately.

FIG. 2 is a block diagram of the pulse modulator of FIG. 1, with the in-phase signal path and the quadrature signal path shown separately. The upper half of FIG. 2 shows the in-phase signal path 14, which processes the real part R of the input signal x(t). The lower half of FIG. 2 shows the quadrature signal path 15 for processing the imaginary part I of the input signal. The real part of the control error is determined at the addition node 16 of the in-phase path as the difference between the real part R of the input signal and the real part 17 of the feedback signal. The integrator value, stored in a delay element 18, is added to this control error and passed via a signal line 19 to the addition node 16. The signal line 19, combined with the delay element 18, form an integrator with the transfer function $H(z)=1/(1-z^{-1})$.

The addition of the real part of the control error to the previous integrator value produces a new integrator value that is once again stored in the delay element 18. The integrated signal 20 in the in-phase signal path is scaled by the factor "a" at an amplifier 21, and is then passed as an amplified signal 22 to a first multiplier 23. The first multiplier 23 multiplies the real, amplified signal 22 by the real signal $\cos(\omega_0 t)$, (i.e. by the real part of $\exp(-j\omega_0 t)$). The first multiplier 23 determines the product $R\cdot\cos(\omega_0 t)$, which is supplied as a signal 24 to an adder 25.

The quadrature signal path 15 of the pulse modulator includes an addition node 26 in which the difference between the imaginary part I of the input signal and an imaginary part 27 of the feedback signal is calculated. This difference, which corresponds to the imaginary part of the control error, is added to the previous content of a delay element 28 that is passed to the addition node 26 via a signal line 29. The new value, which is obtained as the sum of the previous value and the imaginary part of the control error, is written to the delay element 28. Together with the signal line 29, the delay element 28 forms an integrator with the transfer function $H(z)=1/(1-z^{-1})$. The integrated signal 30 from the quadrature signal path is produced at the output of the integrator, and is scaled by the factor "a" of an amplifier 31. An amplified signal 32 obtained in this way is then multiplied by the signal $\sin(\omega_0 t)$ in a second multiplier 33. The product $I\cdot\sin(\omega_0 t)$ obtained in this way is supplied as a signal 34 to the adder 25. The adder 25 adds the signals $R\cdot\cos(\omega_0 t)$ and $I\cdot\sin(\omega_0 t)$ and produces the signal $R\cdot\cos(\omega_0 t)+I\cdot\sin(\omega_0 t)$ as a signal 35. The signal 35 corresponds precisely to the real part of the up-mixed signal as the complex multiplication of x(t) and $\exp(-j\omega_0 t)$ shows:

$$x(t)\cdot\exp(-j\omega_o t) = (R+j\cdot I)\cdot(\cos(\omega_0 t)-j\cdot\sin(\omega_0 t))$$
$$= [R\cdot\cos(\omega_0 t)+I\cdot\sin(\omega_0 t)]+j\cdot$$
$$[I\cdot\cos(\omega_0 t)-R\cdot\sin(\omega_0 t)]$$

The real part of this signal is $R\cdot\cos(\omega_0 t)+I\cdot\sin(\omega_0 t)$. The signal 35 thus represents the real part of the complex up-mixed signal, and, to such extent, corresponds to the signal 11 illustrated in FIG. 1.

The digital real signal 35 is applied to a quantizer 36 that converts it to the quantized pulsed signal y(t). The three-stage (ternary) quantizer of FIGS. 1 and 2 quantizes the input signal on the basis $y(t)\in\{-1; 0; +1\}$. For this, the quantizer 36 includes comparators that continuously compare the level of the signal 35 with predetermined threshold values. Depending on the result of such comparisons, the output signal y(t) is assigned one of the values −1; 0; +1 in each case as the current signal value. Instead of three-stage (ternary) quantization, other desired quantizations may be employed depending on the purpose (e.g. two-stage (binary) or multiple-stage quantizations).

The real part 17 and the imaginary part 27 of the complex feedback signal are derived from the quantized pulsed signal y(t). For this, the pulsed signal y(t) is multiplied by the complex-conjugate mixing signal $\exp(-j\omega_0 t)$ $$y(t)\cdot\exp(-j\omega_0 t)=y(t)\cdot\cos(\omega_0 t)+j\cdot y(t)\cdot\sin(\omega_0 t)$$

The real part $y(t)\cdot\cos(\omega_0 t)$ of the complex feedback signal is produced by the third multiplier 37 that multiplies the pulsed signal y(t) by $\cos(\omega_0 t)$. The real part 17 of the feedback signal is thus produced at the output of the third multiplier 37 and fed back to the addition node 16. In order to produce the imaginary part $y(t)\cdot\sin(\omega_0 t)$ of the complex feedback signal, the pulsed signal y(t) is multiplied by $\sin(\omega_0 t)$ at the fourth multiplier 38. The imaginary part 27 of the feedback signal is produced at the output of the fourth multiplier 38 and fed back to the addition node 26.

Integrators are provided on the input side in the exemplary embodiments of FIGS. 1 and 2 that integrate the control error existing between the input signal and the feedback signal to produce an integrated signal. The transfer function H(z) of an integrator can be represented as $H(z)=1/(1-z^{-1})$. Other signal conversion stages (with other transfer functions H(z)) may be employed on the input side rather than the integrators. For example, higher-order transfer functions H(z) may be used, in which case, however:

$$\lim H(z)=\infty z\to 1.$$

The transfer function H(z) should thus tend to infinity as the frequency $\omega$ tends to zero ($z\to 1$). The additional free parameters of H(z) may be employed to optimize specific characteristics of the modulator (e.g. signal-to-noise ratio) or of the overall system.

Figure 3:
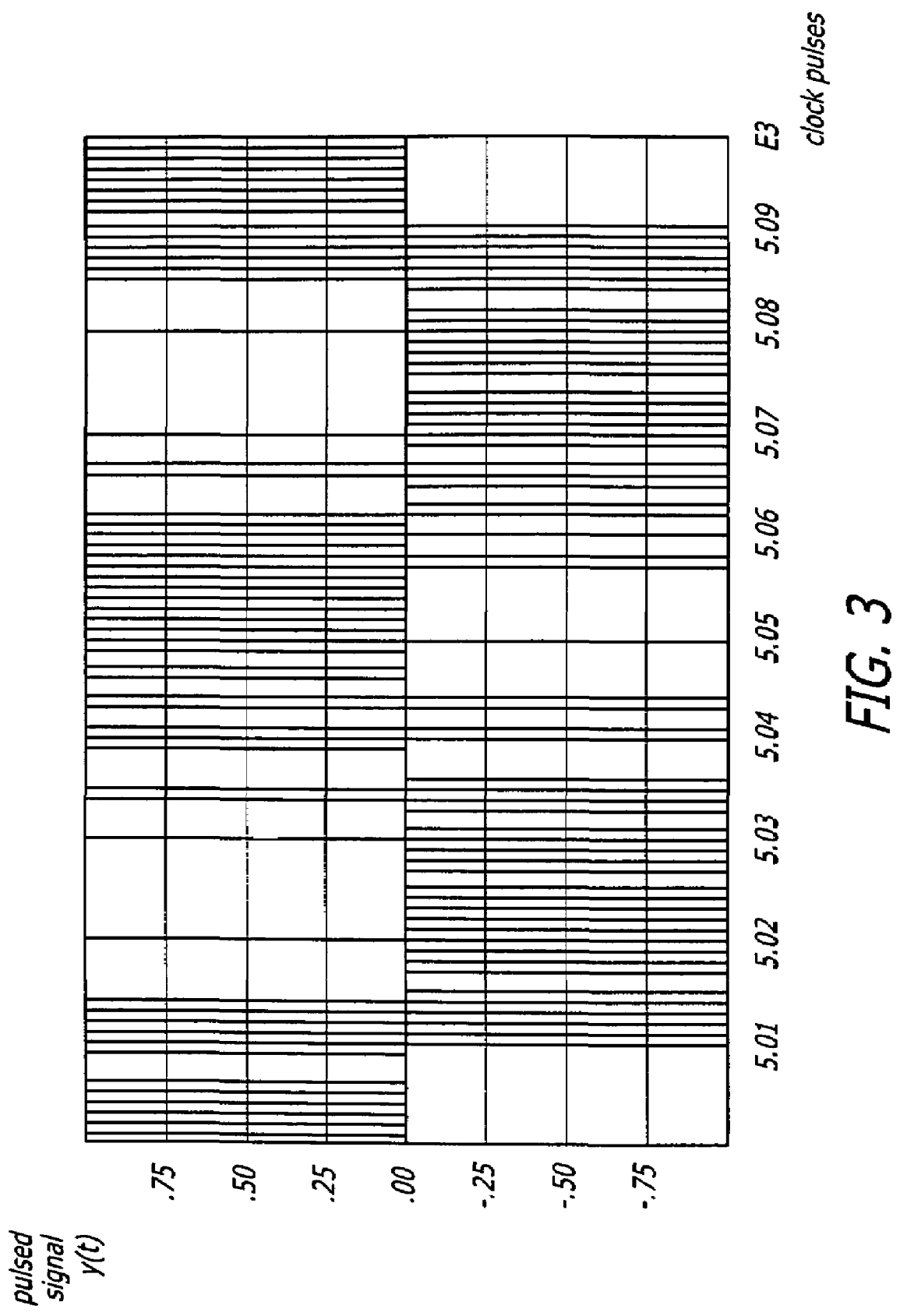
FIG. 3 illustrates a ternary-quantized pulsed signal y(t)

FIG. 3 illustrates the waveform of the pulsed signal y(t) that can be tapped off at the output of the quantizer for ternary quantization with $y(t)\in\{-; 0; +1\}$ determined by computer simulation. The real part R of the complex input signal was set to 0.3, while the imaginary part I of the input signal was set to zero. The input signal x(t) is thus constant and does not vary with time. The sampling frequency $\omega_A$ was set five times the mixing frequency $\omega_0/\omega_A=0.2$. Clock pulses at the sampling frequency $\omega_A$ are shown on the abscissa, numbered successively from 5000 to 5100. During each clock cycle, the pulsed signal y(t) assumes one of the three possible values −1; 0; +1. The value of y(t) during one specific clock cycle at the sampling frequency is plotted on the ordinate.

Figure 4:
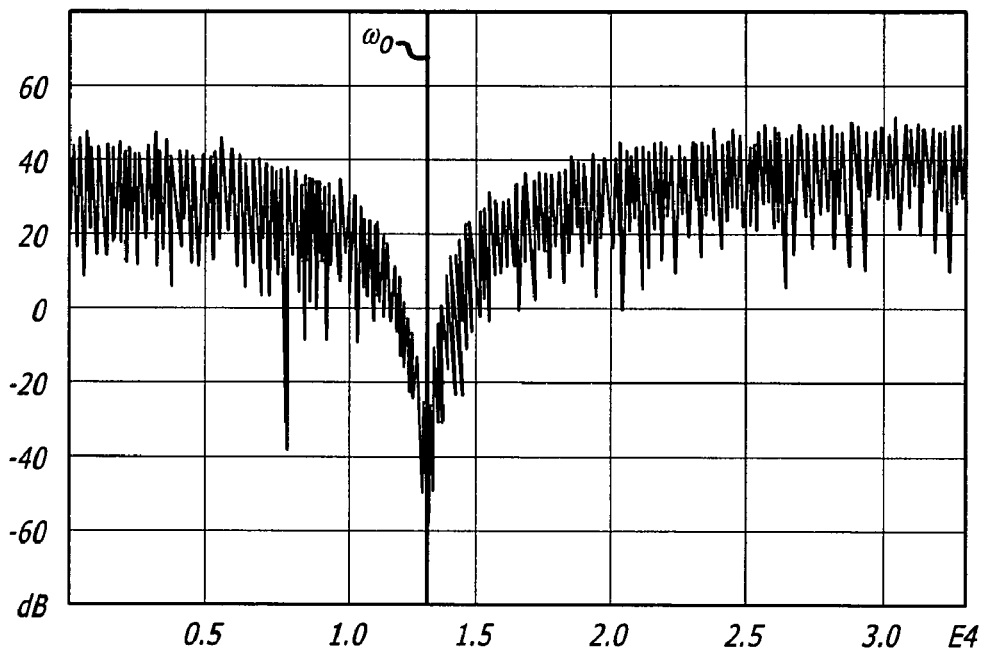
FIG. 4 is a graph of the frequency spectrum of the pulsed signal y(t) produced at the output of the quantizer.

FIG. 4 is a graph of the spectrum of the pulsed signal of FIG. 3 obtained from a spectral analysis (FFT). The frequencies of the spectral components are shown in arbitrary FFT units on the abscissa while signal intensity is plotted in dB on the ordinate. A peak can be seen in the spectral distribution at frequency $\omega_0$. It can also be seen that the noise level in the vicinity of $\omega_0$ is considerably less than in the remaining part of the spectrum. In a conventional sigma-delta modulator, the noise level would, in contrast, be considerably reduced at low frequencies (i.e. in the vicinity of $\omega_0$). In a pulse modulator in accordance with the invention, the integrated and amplified signal is up-mixed to the mixing frequency $\omega_0$ by a complex multiplication. As a result, the spectral range over which the noise is reduced is also shifted toward the mixing frequency $\omega_0$, resulting in the noise characteristic of the graph of FIG. 4.

The pulse modulator of the invention may be used for digital synthesis of a pulsed signal. In this case, the main spectral component of the pulsed signal can be predetermined by the mixing frequency $\omega_0$. The phase angle of the pulsed signal produced can be set exactly by the ratio of the real to the imaginary part of the input signal. This results in a pulsed signal whose phase is stable.

When using a pulse modulator in accordance with the invention for frequency synthesis, the pulsed signal y(t) should be filtered by means of an electrical bandpass filter, whose passband is centered around the frequency $\omega_0$. Such a filter which may, for example, be in the form of a crystal or ceramic filter, makes it possible to suppress spectral ranges further removed from $\omega_0$ where the noise level is undesirably high. A bandpass filter such as this makes it possible to significantly improve the signal-to-noise ratio.

Figure 5:
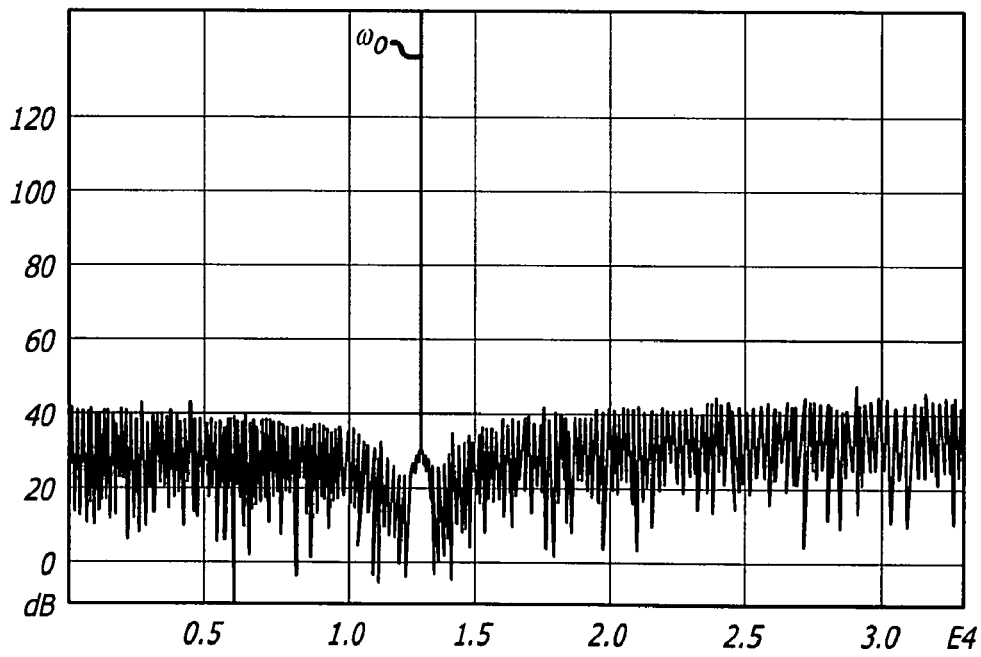
FIG. 5 is a graph of the frequency spectrum of the preceding figure after filtering by a micromechanical oscillator.

The pulse modulator of the invention is suitable, inter alia, for stimulation of electromechanical oscillators to carry out harmonic oscillations. In particular, the electrostatic forces required for oscillation stimulation can be produced by a ternary-quantized pulsed signal applied to the stimulation electrodes of a micromechanical resonator. The frequency $\omega_0$ of the pulsed signal y(t) is preferably chosen to be equal to the resonant frequency of the micromechanical oscillator in this case. If the pulsed signal, as illustrated in FIGS. 3 and 4, is used for harmonic stimulation of a high Q-factor oscillator (e.g., with a Q-factor of $10^4$), whose resonant frequency corresponds to the stimulation frequency $\omega_0$, the majority of the quantization noise is filtered out by the oscillator. That is, the quantization noise in spectral ranges further removed from the resonant frequency $\omega_0$ is suppressed by the oscillator itself. The filtered spectrum obtained in this way is illustrated by the graph of FIG. 5.

Figure 6:
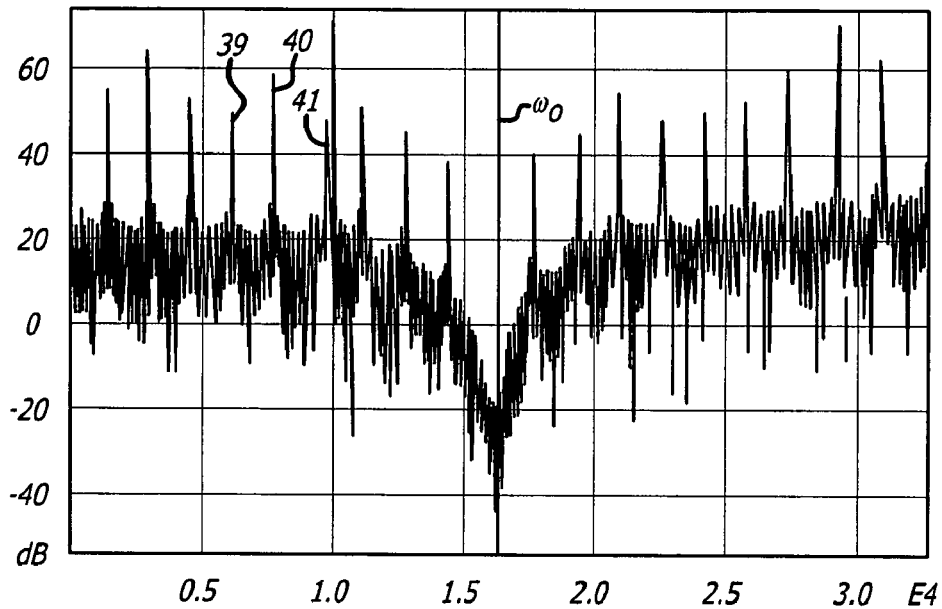
FIG. 6 is a graph of the frequency spectrum of a pulsed signal y(t) plotted for a ratio of the mixing frequency to the sampling frequency of $\omega_0/\omega_A$=0.25.

Specific ratios of the frequencies $\omega_0/\omega_A$ exist that result in conversion of the noise-like quantization product in y(t) to a series of more or less periodic functions. An example is illustrated in FIG. 6, a graph of the frequency spectrum obtained for the ratio $\omega_0/\omega_A=0.25$. A range of spectral lines 39, 40, 41, etc. can be seen in addition to the peak at $\omega_0$. Such spectral lines result from the fact that the quantizer is a highly non-linear element in the control loop. This stimulates relaxation oscillations in the control loop with certain frequency ratios. Such control loop response is recognized to exist in conventional delta-sigma converters.

Figure 8:
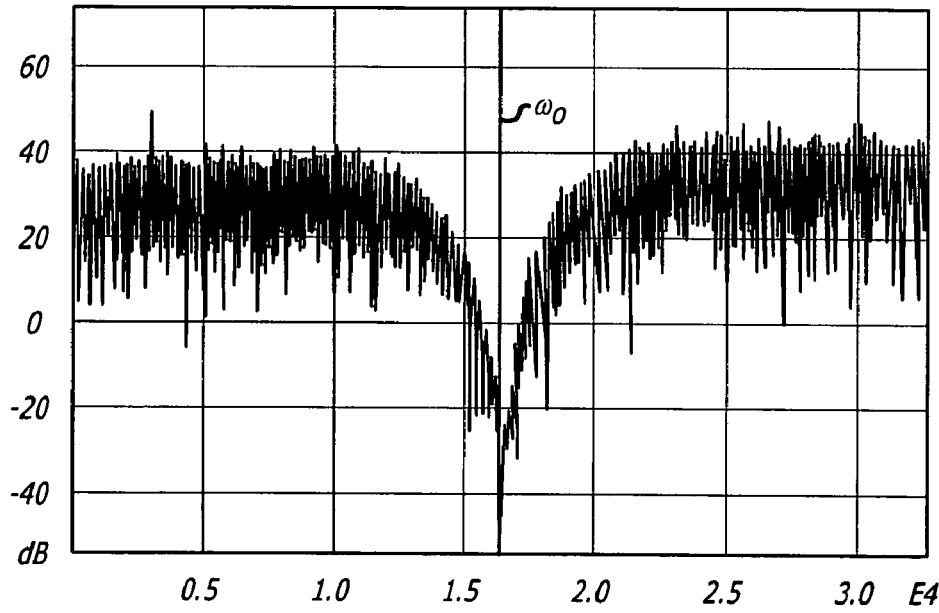
FIG. 8 is a graph of the frequency spectrum of the signal of FIG. 6 with statistical rounding.
Figure 7:
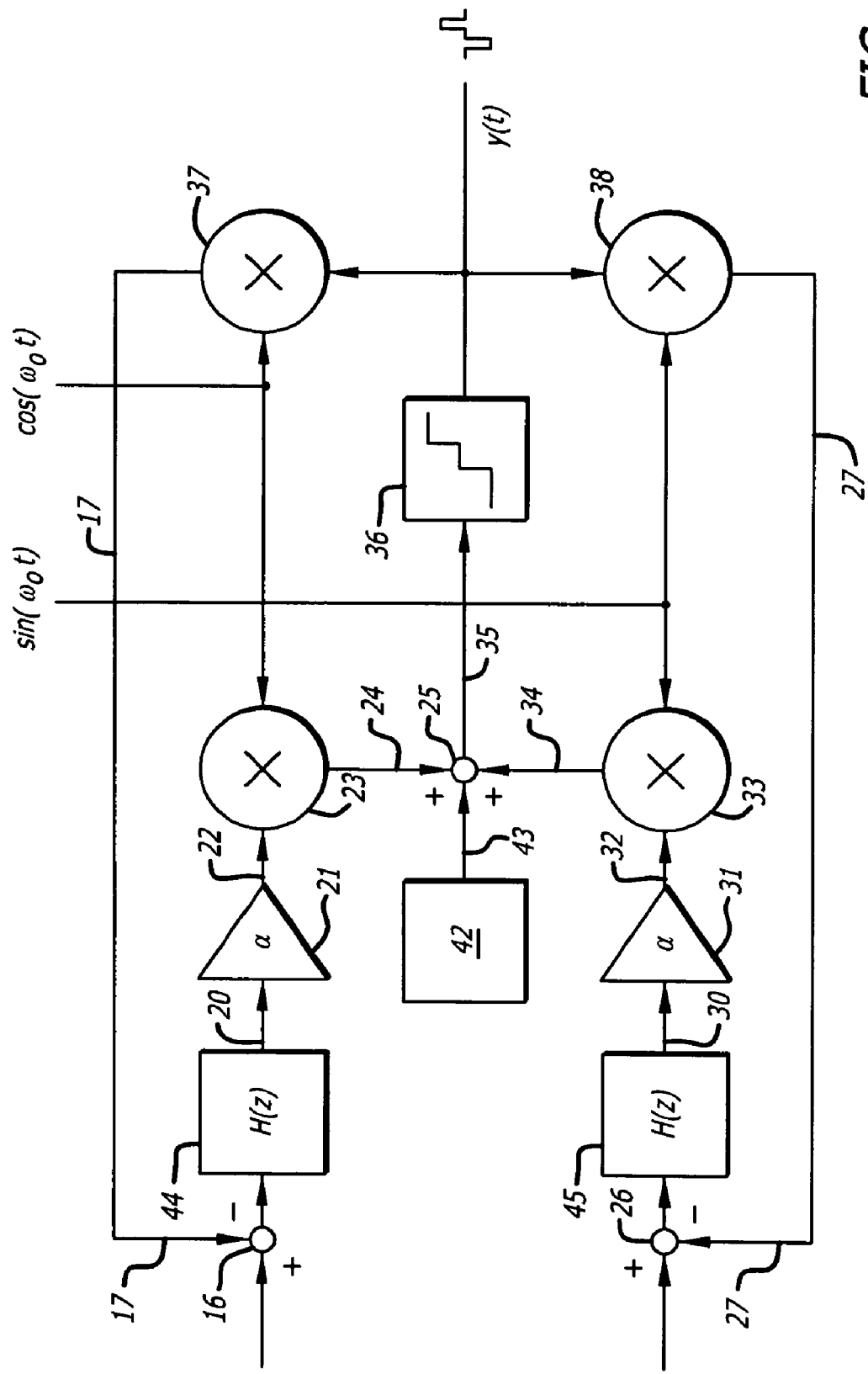
FIG. 7 is a block diagram of a pulse modulator with statistical rounding.

The central linearity of the quantizer can be improved by adding a noise signal to the input signal to prevent the creation of relaxation oscillations. A spectrally uniformly distributed noise signal is preferably employed for this purpose. FIG. 7 is a block diagram of a correspondingly modified pulse modulator. In comparison to the block diagram of FIG. 2, the pulse modulator of FIG. 7 additionally comprises a noise generator 42 that produces a noise signal 43. Also, the integrators shown in FIG. 2 are illustrated in a generalized form as signal conversion stages 44, 45 with transfer function H(z). Otherwise, the assemblies of FIG. 7 correspond to the elements of the block diagram of FIG. 2. The noise signal 43 is supplied to the adder 25, where it is added to the signals 24 and 34. The signal 35 at the input of the quantizer 36 thus has a superimposed noise signal. This eventually leads to statistical rounding in the quantization process. The graph of FIG. 8 illustrates the frequency spectrum of a pulsed signal y(t) produced with the aid of a pulse modulator modified as shown in FIG. 7. Although the frequency ratio $\omega_0/\omega_A$ is once again equal to 0.25, no relaxation oscillations are formed.

The pulse modulator of the invention can be used, in particular, for electrostatic stimulation of micromechanical oscillators. For such purpose, by way of example, a ternary-quantized pulsed signal of the type shown in FIG. 3 can be connected to the stimulation electrodes of a micromechanical resonator. The pulsed signal of FIG. 3 represents a sinusoidal signal of frequency $\omega_0$. Such a pulsed signal can be used to stimulate a micromechanical resonator to carry out harmonic oscillations at the frequency $\omega_0$. This is particularly true when the frequency $\omega_0$ of the pulsed signal corresponds (at least approximately) to the resonant frequency of the oscillator.

Figure 9:
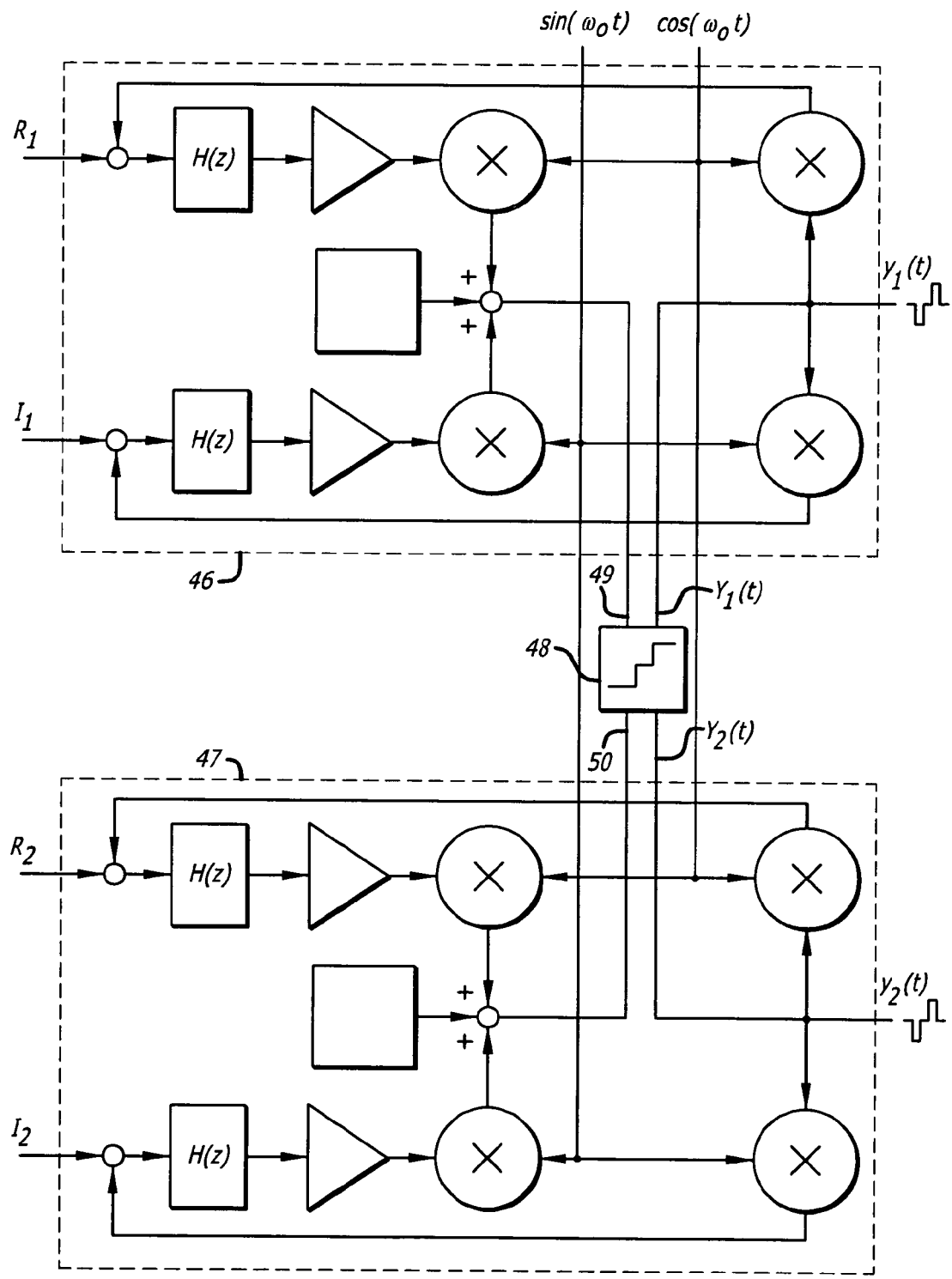
FIG. 9 is a block diagram of a two-dimensional pulse modulator.

Resonators that can oscillate in two mutually perpendicular directions $y_1$ and $y_2$ are employed in rotation rate sensors and Coriolis gyros. The two-dimensional pulse modulator illustrated in FIG. 9 may be employed for electrostatic stimulation of a two degree of freedom resonator. The two-dimensional pulse modulator has a first pulse modulator 46 that produces the pulsed signal $y_1(t)$ from the complex input signal $R_1$, $I_1$. The pulsed signal is used to stimulate the resonator in the $y_1$ direction. The pulsed signal $y_2(t)$ is produced from the complex input signal $R_2$, $I_2$ by a second pulse modulator 47. This pulsed signal is employed to stimulate the oscillator to oscillate in the $y_2$ direction. Both the first pulse modulator 46 and the second pulse modulator 47 are of the type with statistical rounding as shown in FIG. 7. A description of the design and method of operation of the first and second pulse modulators 46, 47 can thus be found in the portion of the description relating to FIGS. 2 and 7. However, the two-dimensional pulse modulator of FIG. 9 includes a 2D quantizer 48 that is shared by the two channels. It converts the signal 49 of the first pulse modulator 46 to the quantized pulsed signal $y_1(t)$ and transforms the signal 50 of the second pulse modulator 47 to the quantized pulsed signal $y_2(t)$ The use of a 2D quantizer 48 shared by the two channels makes it possible to take into account additional conditions advantageous for operation of the micromechanical sensor during quantization of the signals 49, 50. One such additional condition, for example, is that in each case only one of the channels may produce pulses other than zero. Another feasible additional condition is that only one of the output signals $y_1(t)$, $y_2(t)$ may change in each case at any given time. Additional conditions may be worthwhile when the displacement currents applied to the electrodes of a double resonator are measured in sum form, making it possible to deduce the deflection of the oscillator. The additional conditions make it possible to associate a displacement current unambiguously with one specific electrode. This makes it possible to carry out signal separation between the signals caused by the $y_1$ and $y_2$ deflections of the oscillator.

In summary, the operation of a pulse modulator in accordance with the invention represents an advantageous modification of a conventional sigma-delta converter. It has been explained above, for an input signal that is kept constant without any restriction to generality. The subtraction and signal conversion stages convert the input signal to a control signal that also varies only slightly in time. In contrast to conventional sigma-delta converters, the control signal is, however, now multiplied by the first multiplication stage by a complex mixing signal at the frequency $\omega_0$ to produce a control signal up-mixed to the frequency $\omega_0$. The real or the imaginary part of the control signal, oscillating at the frequency $\omega_0$, is then quantized by the quantization stage, resulting in a real pulsed signal with a dominant frequency component at the frequency $\omega_0$ at the output of the quantization stage. The real pulsed signal, together with the aid of positive or negative pulses, simulates a sinusoidal signal at the frequency $\omega_0$. Such pulsed signal represents the point of origin for calculation of the feedback signal. Such feedback signal is fed back to the subtraction stage where it is subtracted from the input signal to determine the control error.

It is not absolutely essential to calculate both the real and imaginary parts of the control signal up-mixed by $\omega_0$ to produce the pulsed signal. If the intention is to derive the pulsed signal from the real part of the up-mixed control signal, the imaginary part of the up-mixed control signal need not necessarily be produced.

The major advantage of the pulse modulator of the invention over conventional sigma-delta modulators is that the range of low quantization noise is shifted from the vicinity of $\omega=0$ toward the operating frequency $\omega_0$. This is achieved by complex up-mixing of the control signal in the first multiplication stage. It results in a pulsed signal that has a low noise level in the relevant spectral range around $\omega_0$.

The starting point for understanding the noise characteristic is that the signal conversion stage, which may be formed, for example, by an integrator, has a low-pass characteristic. This means that relatively high-frequency components are partially suppressed by the signal conversion stage. In conventional sigma-delta converters, this suppression of the higher-frequency components in the control loop causes a rise in the quantization noise at higher frequencies. In contrast, the quantization noise in the low-frequency range is low. In the case of the pulse modulator of the invention, the control signal, which can be tapped off at the output of the signal conversion stage, is up-mixed to the frequency $\omega_0$ by multiplication by the complex mixing signal at the frequency $\omega_0$. The range of low quantization noise is thus also shifted from the frequency $\omega=0$ toward the mixing frequency $\omega_0$, even though the signal conversion stage on the input side is still processing a signal which has not been up-mixed. This results in a pulsed signal with a noise level which is low in the vicinity of $\omega_0$.

The pulse modulator according to the invention can be implemented at low cost, requires relatively little electrical power, and can easily be integrated together with the digital electronics.

It is advantageous for the pulse modulator to have an in-phase signal path for processing of the real part of the input signal, as well as a quadrature signal path for processing of the imaginary part of the input signal. It is also advantageous for the control error signal, the control signal and the feedback signal to be complex signals with each having a real signal component as well as an imaginary signal component. To insure that the real pulsed signal reflects the real or the imaginary part of the control signal up-mixed by $\omega_0$ in the correct phase, the subtraction stage, the signal conversion stage, the first multiplication stage and the feedback unit are complex signal processing units which have an in-phase signal path and a quadrature signal path. Only the real part (or the imaginary part) of the output signal from the first multiplication stage is required to derive the real pulsed signal from it with the aid of the quantization stage. The quantization stage may thus be a real processing stage. In fact, the real pulsed signal is then once again converted to a complex feedback signal in the feedback unit. This design of the pulse modulator makes it possible to synthesize a real pulsed signal, which reproduces a harmonic oscillation at the frequency $\omega_0$ with low phase and amplitude noise, with the correct phase.

According to one advantageous embodiment of the invention, the signal conversion stage has an integrator stage that integrates the control error signal and produces an integrated signal as the control signal. Integration of the control error signal makes it possible to slave the (complex) integrated signal continuously to the complex input signal. Since an integrator stage has a low-pass filter characteristic, this results in a control signal at the output of the integrator stage with a reduced noise level in the region around $\omega_0$. If this control signal is then up-mixed by the first multiplication stage, and then quantized, a pulsed signal with the desired noise characteristic results.

It is advantageous for the integrator stage to have a first integrator for the in-phase signal path and a second integrator for the quadrature signal path. The first integrator integrates the real part and the second integrator integrates the imaginary part of the control error signal. A complex integrator stage for the complex control error signal can be produced in this way with the aid of two separate integrators.

It is advantageous for the signal conversion stage to have an amplifier stage. The gain factor is chosen so that the quantizer receives the correct input signal level.

According to a further advantageous embodiment of the invention, the first multiplication stage has a first multiplier for the in-phase signal path and a second multiplier for the quadrature signal path. The first multiplier multiplies the real part of the control signal by the real part of the complex mixing signal oscillating at the frequency $\omega_0$, and thus produces a first result signal. The second multiplier multiplies the imaginary part of the control signal by the imaginary part of the complex mixing signal oscillating at the frequency $\omega_0$, and thus produces a second result signal. According to a further advantageous embodiment, the pulse modulator has an adder that adds the first result signal from the first multiplier and the second result signal from the second multiplier to form a sum signal to determine the real part of the up-mixed control signal.

If it is assumed that the complex control signal is in the form $R+j \cdot I$, and, by way of example, the complex mixing signal is represented in the form $\exp(-j\omega_0 t)$, then the first result signal from the first multiplier becomes $R \cdot \cos(\omega_0 t)$. The second result signal from the second multiplier assumes the form $I \cdot \sin(\omega_0 t)$, and the adder produces the signal $R \cdot \cos(\omega_0 t) + I \cdot \sin(\omega_0 t)$ as the sum signal. However, this signal corresponds precisely to the real part of $(R+j \cdot I) \cdot \exp(-j\omega_0 t)$. The real part of the complex multiplication of the control signal and mixing signal can thus be determined by the first multiplier, the second multiplier and the adder.

According to an advantageous embodiment of the invention, the sum signal produced by the adder is then quantized by the quantization stage to produce the real pulsed signal. In this case, it is advantageous for a noise level to be added to the input signal to the quantization stage. The pulse modulator is clocked at a sampling frequency $\omega_A$ that must be considerably higher than the mixing frequency $\omega_0$. Certain ratios of $\omega_0$ to $\omega_A$ result in relaxation oscillations being formed in the pulse modulator. These can be seen as additional peaks in the frequency spectrum of the pulsed signal. Since a noise signal is added to the input signal to the quantizer, the result of the quantization process is statistically rounded. This trick makes it possible to prevent the formation of relaxation oscillations.

The quantization stage preferably carries out binary or ternary quantization of its respective input signal. In the case of binary quantization, the pulsed signal may assume only the values 0 and 1. A pulsed signal is thus produced that contains only positive voltage pulses. A ternary-quantized pulsed signal may assume the values $-1, 0, 1$. A pulsed signal such as this comprises both positive and negative voltage pulses. Ternary quantization is carried out whenever a pulsed signal is required with both positive and negative pulses.

The feedback unit preferably has a second multiplication stage that multiplies the pulsed signal by a complex-conjugate mixing signal oscillating at the frequency $\omega_0$. It thus produces the feedback signal down-mixed by $\omega_0$ for the subtractor. The pulsed signal is produced by quantization of the real part of the up-mixed control signal, and thus has its dominant frequency component at the frequency $\omega_0$. Before the pulsed signal can be used as a feedback signal, it must be down-mixed again to baseband. For this purpose, the pulsed signal is multiplied by a complex-conjugate mixing signal at the frequency $\omega_0$ to obtain a down-mixed complex feedback signal.

The second multiplication stage preferably has a third multiplier for production of the real part of the feedback signal and a fourth multiplier for production of the imaginary part of the feedback signal. The third multiplier multiplies the pulsed signal by the real part of the complex-conjugate mixing signal oscillating at the frequency $\omega_0$. The fourth multiplier multiplies the pulsed signal by the imaginary part of the complex-conjugate mixing signal at the frequency $\omega_0$. The multiplication of the pulsed signal by the mixing signal must be carried out in complex form to shift that frequency component of the pulsed signal at the frequency $\omega_0$ in the correct direction. The pulsed signal y(t) is a real signal, while the complex-conjugate mixing signal can be represented in the form $\exp(-j\omega_0 t)$. The complex multiplication thus produces a complex feedback signal with the real part $y(t) \cdot \cos(\omega_0 t)$ and the imaginary part $y(t) \cdot \sin(\omega_0 t)$.

The pulse modulator is preferably operated at a sampling frequency $\omega_A$ which is 2 to 1000 times higher than the mixing frequency $\omega_0$. This is necessary to satisfy the Nyquist condition for the up-mixed signals.

According to a further advantageous embodiment, the pulse modulator is implemented with the aid of a digital signal processor (DSP). All of the operations which are required for operation of the pulse modulator can be programmed with the aid of signal processing routines.

The drive circuit of the invention for a micromechanical resonator has at least one pulse modulator of the type described above. The pulsed signal produced by the at least one pulse modulator is preferably used for electrostatic oscillation stimulation of the resonator. The pulsed signal produced can be directly connected to the stimulation electrodes of the resonator. In this case, it is advantageous for the mixing frequency $\omega_0$ of the pulse modulator to correspond to one resonant frequency of the resonator, as this then insures effective stimulation of the oscillator.

A frequency generator in accordance with the invention for synthesis of a pulsed signal at a predetermined frequency with a predetermined phase has at least one pulse modulator of the type described above. The pulse modulator according to the invention can be used to produce a corresponding pulsed signal y(t) at a predetermined frequency with a predetermined phase. In this case, the phase angle of the pulsed signal produced can be very precisely predetermined by the ratio of the real to the imaginary part of the input signal x(t). The pulsed signal produced has a low noise level in the vicinity of $\omega_0$.

According to a further advantageous embodiment, the pulse modulator is followed by a bandpass filter, preferably a crystal or ceramic filter. This downstream bandpass filter allows those frequency components remote from $\omega_0$ and in which the noise level is high to be filtered out.

While the invention has been described with reference to its presently-preferred embodiment, it is not limited thereto. Rather, the invention is limited only insofar as it is defined by the following set of claims and includes within its scope all equivalents thereof.

The invention claimed is:

1. A drive circuit for a micromechanical resonator, which has at least one pulse modulator for conversion of a complex input signal to a pulsed signal, and which has:
   a subtraction stage which produces a control error signal from the difference between the complex input signal and a feedback signal;
   a signal conversion stage, which converts the control error signal to a control signal;
   a first multiplication stage, which multiplies the control signal by a complex mixing signal oscillating at the frequency $\omega_0$, and thus produces at least one of a real part and an imaginary part of a control signal which has been up-mixed by $\omega_0$,
   a quantization stage, which quantizes at least one of the real part and imaginary part of the control signal which has been up-mixed by $\omega_0$ and thus produces the pulsed signal, with the pulsed signal which is produced by the at least one pulse modulator being used for electrostatic oscillation stimulation of a resonator, and with the pulse modulator being operated at a sampling frequency $\omega_A$ which is 2 to 1000 times higher than the mixing frequency $\omega_0$,
   a feedback unit, which uses the pulsed signal to produce the feedback signal for the subtraction stage,
   said first multiplication stage having a first multiplier for the in-phase signal path and a second multiplier for the quadrature signal path, with the first multiplier multiplying the real part of the control signal by the real part of the complex mixing signal oscillating at the frequency $\omega_0$, and thus producing a first result signal, and with the second multiplier multiplying the imaginary part of the control signal by the imaginary part of the complex mixing signal oscillating at the frequency $\omega_0$, and thus producing a second result signal; and
   the pulse modulator has an adder which adds the first result signal from the first multiplier and the second result signal from the second multiplier to form a sum signal in order to determine the real part of the up-mixed control signal.

2. The drive circuit as claimed in claim 1, characterized in that the mixing frequency $\omega_0$ of the pulse modulator corresponds to one resonant frequency of the resonator.

3. The drive circuit as claimed in claim 1, characterized in that the pulse modulator has an in-phase signal path for processing of the real part of the input signal, as well as a quadrature signal path for processing of the imaginary part of the input signal.

4. The drive circuit as claimed in claim 1, characterized in that the control error signal, the control signal and the feedback signal are each complex signals, which each have a real signal component as well as an imaginary signal component.

5. The drive circuit as claimed in claim 1, characterized in that the signal conversion stage has an integrator stage which integrates the control error signal and produces an integrated signal as the control signal.

6. The drive circuit as claimed in claim 5, characterized in that the integrator stage has a first integrator for the inphase signal path and a second integrator for the quadrature signal path, with the first integrator integrating the real part of the control error signal, and with the second integrator integrating the imaginary part of the control error signal.

7. The drive circuit as claimed in claim 1, characterized in that the signal conversion stage has an amplifier stage.

8. The drive circuit as claimed in claim 1, characterized in that the quantization stage quantizes the sum signal produced by the adder.

9. The drive circuit as claimed in claim 1, characterized in that a noise level is added to the input signal to the quantization stage.

10. The drive circuit as claimed in claim 1, characterized in that the quantization stage carries out binary quantization or ternary quantization of its respective input signal.

11. The drive circuit as claimed in claim 1, characterized in that the feedback unit has a second multiplication stage, which multiplies the pulsed signal by a complex-conjugate mixing signal oscillating at the frequency $\omega_0$, and thus produces the feedback signal down-mixed by $\omega_0$, for the subtractor.

12. The drive circuit as claimed in claim 11, characterized in that the second multiplication stage has a third multiplier for production of the real part of the feedback signal and has a fourth multiplier for production of the imaginary part of the feedback signal, with the third multiplier multiplying the pulsed signal by the real part of the complex-conjugate mixing signal oscillating at the frequency $\omega_0$, and with the fourth multiplier multiplying the pulsed signal by the imaginary part of the complex-conjugate mixing signal at the frequency $\omega_0$.

13. The drive circuit as claimed in claim 1, characterized in that the pulse modulator is implemented with the aid of a digital signal processor.

14. A method for pulse modulation of a complex input signal, characterized by the following steps:
production of a control error signal from the difference between the complex input signal and a feedback signal;
conversion of the control error signal to a control signal;
multiplication of the control signal by a complex mixing signal oscillating at the frequency $\omega_0$, wherein the real part of the control signal is multiplied by the real part of the complex mixing signal oscillating at the frequency $\omega_0$, and a first result signal is thus produced, and the imaginary part of the control signal is multiplied by the imaginary part of the complex mixing signal oscillating at the frequency $\omega_0$, and a second result signal is thus produced;
the first result signal and the second result signal form a sum signal in order to determine the real part of the up-mixed control signal;
quantization of at least one of the real part and imaginary part of the control signal, up-mixed by $\omega_0$, in order to produce a pulsed signal, with the pulsed signal being used for electrostatic oscillation stimulation of a micromechanical resonator, and with the pulse modulation being carried out at a sampling frequency $\omega_A$ which is 2 to 1000 times higher than the mixing frequency $\omega_0$;
production of the feedback signal from the pulsed signal.

15. The method as claimed in claim 14, characterized in that the control error signal, the control signal and the feedback signal are each complex signals, which each have a real signal component as well as an imaginary signal component.

16. The method as claimed in claim 14, characterized in that the control error signal is converted to the control signal by integrating the control error signal.

17. The method as claimed in claim 14, characterized in that the sum signal is quantized in order to produce the pulsed signal.

18. The method as claimed in claim 14, characterized in that a noise level is added before the quantization of at least one of the real part and imaginary part of the control signal up-mixed by $\omega_0$.

19. The method as claimed in claim 14, characterized in that the feedback signal is produced by multiplying the pulsed signal by a complex-conjugate mixing signal oscillating at the frequency $\omega_0$.

20. The method as claimed in claim 14, characterized in that the mixing frequency $\omega_0$ corresponds to one resonant frequency of the micromechanical resonator.

21. A rotation rate sensor of the type that comprises a drive circuit and a micromechanical resonator, wherein said drive circuit includes at least one pulse modulator for conversion of a complex input signal to a pulsed signal for application to said resonator, said drive circuit further including:
a subtraction stage which produces a control error signal from the difference between the complex input signal and a feedback signal;
a signal conversion stage, which converts the control error signal to a control signal by integration;
a first multiplication stage, which multiplies the control signal by a complex mixing signal oscillating at the frequency $\omega_0$, and thus produces at least one of a real part and an imaginary part of a control signal which has been up-mixed by $\omega_0$,
a quantization stage, which quantizes at least one of the real part and imaginary part of the control signal which has been up-mixed by $\omega_0$ and thus produces the pulsed signal, with the pulsed signal which is produced by the at least one pulse modulator and which is used for electrostatic oscillation stimulation of the micromechanical resonator, and with the pulse modulator being operated at a sampling frequency $\omega_A$ which is 2 to 1000 times higher than the mixing frequency $\omega_0$, and
a feedback unit, which uses the pulsed signal to produce the feedback signal for the subtraction stage.

22. A method for operating a rotation rate sensor of the type in which a micromechanical resonator is driven using pulse modulation of a complex input signal, characterized by the following steps:
production of a control error signal from the difference between the complex input signal and a feedback signal;
conversion of the control error signal to a control signal by integration;
multiplication of the control signal by a complex mixing signal oscillating at the frequency $\omega_0$, with at least one of the real part and imaginary part of a control signal, up-mixed by $\omega_0$, being produced;
quantization of at least one of the real part and imaginary part of the control signal, up-mixed by $\omega_0$, in order to produce a pulsed signal, with the pulse modulation being carried out at a sampling frequency $\omega_A$ which is 2 to 1000 times higher than the mixing frequency $\omega_0$;
multiplication of the pulsed signal by a complex mixing signal oscillating at the frequency $\omega_0$ to generate the feedback signal from the pulsed signal; and
using the pulsed signal for electrostatic oscillation stimulation of the micromechanical resonator.

* * * * *